United States Patent
Ellis-Monaghan et al.

(10) Patent No.: US 11,411,087 B2
(45) Date of Patent: Aug. 9, 2022

(54) INTEGRATED CIRCUIT (IC) STRUCTURE WITH HIGH IMPEDANCE SEMICONDUCTOR MATERIAL BETWEEN SUBSTRATE AND TRANSISTOR

(71) Applicant: GLOBALFOUNDRIES U.S. INC., Santa Clara, CA (US)

(72) Inventors: John J. Ellis-Monaghan, Grand Isle, VT (US); Anupam Dutta, Bangalore (IN); Satyasuresh V. Choppalli, Bangalore (IN); Venkata N. R. Vanukuru, Bangalore (IN); Michel Abou-Khalil, Essex Junction, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 17/151,343

(22) Filed: Jan. 18, 2021

(65) Prior Publication Data

US 2022/0181452 A1 Jun. 9, 2022

(30) Foreign Application Priority Data

Dec. 4, 2020 (IN) .............................. 202011052829

(51) Int. Cl.
*H01L 29/78* (2006.01)
*H01L 29/40* (2006.01)

(52) U.S. Cl.
CPC ............ *H01L 29/407* (2013.01); *H01L 29/78* (2013.01)

(58) Field of Classification Search
CPC ........ H01L 29/40; H01L 29/407; H01L 29/78

USPC .......................................................... 257/394
See application file for complete search history.

(56) References Cited

U.S. PATENT DOCUMENTS

| 9,455,262 | B2  | 9/2016 | Widjaja |
| 10,192,779 | B1 | 1/2019 | Shank et al. |
| 10,651,281 | B1 | 5/2020 | Adusumilli et al. |
| 11,004,974 | B1* | 5/2021 | Takimoto .............. H01L 29/404 |
| 2019/0295881 | A1 | 9/2019 | Shank et al. |

FOREIGN PATENT DOCUMENTS

| EP | 2483915 B1 | 6/2019 |
| JP | 2017055140 A | 3/2017 |

* cited by examiner

*Primary Examiner* — Monica D Harrison
(74) *Attorney, Agent, or Firm* — Francois Pagette; Hoffman Warnick LLC

(57) ABSTRACT

Embodiments of the disclosure provide an integrated circuit (IC) structure with a high impedance semiconductor material between a substrate and transistor. The IC structure may include: a substrate, a high impedance semiconductor material on a portion of the substrate, and a transistor on a top surface of the high impedance semiconductor material. The transistor includes a semiconductor channel region horizontally between a first source/drain (S/D) region and a second S/D region. The high impedance semiconductor material is vertically between the transistor and the substrate; a first insulator region is on the substrate and horizontally adjacent the first S/D region; and a first doped well is on the substrate and horizontally adjacent the first insulator region. The first insulator region is horizontally between the first doped well and the transistor.

20 Claims, 4 Drawing Sheets

INTEGRATED CIRCUIT (IC) STRUCTURE WITH HIGH IMPEDANCE SEMICONDUCTOR MATERIAL BETWEEN SUBSTRATE AND TRANSISTOR

TECHNICAL FIELD

Embodiments of the disclosure relate generally to integrated circuit (IC) structures. More specifically, various embodiments of the disclosure provide an IC structure with a high impedance semiconductor material between a substrate and transistor.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs, and capacitors. Circuit chips with hundreds of millions of such devices are common.

Circuit fabricators are currently seeking to reduce the two-dimensional area occupied by device components, e.g., to reduce two dimensional area and power consumption. One concern of miniaturization in radio frequency (RF) devices, has been the reduction of electrical resistance of body connections (e.g., back gate terminals) to transistors, which can reduce the voltage gain and/or linearity of the intended input-output voltage function in a circuit component. In conventional circuits, transistors may offset lower resistances by applying larger voltage biases to the body to reduce capacitance. However, this may not be feasible in many devices or technical settings.

SUMMARY

Aspects of the present disclosure provide an integrated circuit (IC) structure, including: a substrate; a high impedance semiconductor material on a portion of the substrate; a transistor on a top surface of the high impedance semiconductor material, the transistor including a semiconductor channel region horizontally between a first source/drain (S/D) region and a second S/D region, wherein the high impedance semiconductor material is vertically between the transistor and the substrate; a first insulator region on the substrate and horizontally adjacent the first S/D region; and a first doped well on the substrate and horizontally adjacent the first insulator region, wherein the first insulator region is horizontally between the first doped well and the transistor.

Further aspects of the present disclosure provide an integrated circuit (IC) structure, including: a substrate having a top surface; a high impedance semiconductor material within the substrate, wherein a top surface of the high impedance semiconductor material is coplanar with the top surface of the substrate; a transistor on the top surface of the high impedance semiconductor material, the transistor including a semiconductor channel region horizontally between a first source/drain (S/D) region and a second S/D region, wherein the high impedance semiconductor material is vertically between the transistor and the substrate; a first insulator region on the top surface of the substrate and horizontally adjacent the first S/D region; a first doped well within the substrate and horizontally adjacent the first insulator region, wherein the first insulator region is horizontally between the first doped well and the first S/D region of the transistor; a first body terminal on the first doped well; a second insulator region on the top surface of the substrate and horizontally adjacent the second S/D region; a second doped well within the substrate and horizontally adjacent the second insulator region, wherein the second insulator region is horizontally between the second doped well and the second S/D region of the transistor; and a second body terminal on the second doped well.

Yet another aspect of the present disclosure provides an integrated circuit (IC) structure, including: a substrate having a top surface; a high impedance semiconductor material within the substrate, wherein a top surface of the high impedance semiconductor material is coplanar with the top surface of the substrate; a transistor on the top surface of the high impedance semiconductor material, the transistor including a semiconductor channel region horizontally between a first source/drain (S/D) region and a second S/D region, wherein the high impedance semiconductor material is vertically between the transistor and the substrate; a first insulator region on the top surface of the substrate and the top surface of the high impedance semiconductor material, and horizontally adjacent the first S/D region; a second insulator region on the top surface of the substrate and the top surface of the high impedance semiconductor material, and horizontally adjacent the second S/D region; a first doped well on the top surface of the substrate, and horizontally adjacent the first insulator region and the substrate, wherein the first insulator region is horizontally between the first doped well and the transistor; a first body terminal within the first doped well; a second doped well on the top surface of the substrate, and horizontally adjacent the first insulator region and the substrate, wherein the second insulator region is horizontally between the second doped well and the transistor; and a second body terminal within the second doped well.

BRIEF DESCRIPTION OF THE DRAWINGS

These and other features of this disclosure will be more readily understood from the detailed description of the various aspects of the disclosure taken in conjunction with the accompanying drawings that depict various embodiments of the disclosure, in which.

Figure 1:
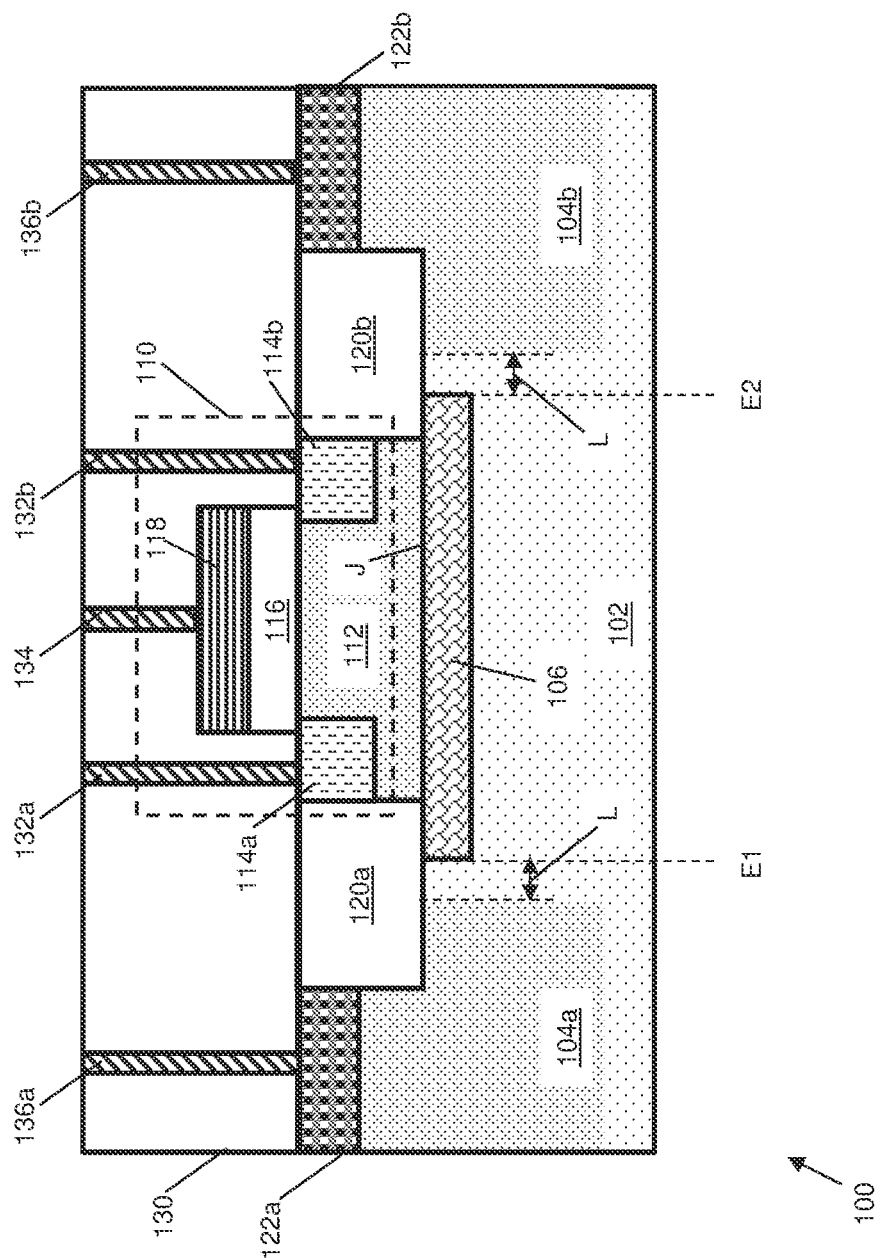
FIG. 1 provides a cross-sectional view of an integrated circuit (IC) structure with a high impedance semiconductor material between a substrate and transistor according to embodiments of the disclosure.

It is noted that the drawings of the disclosure are not necessarily to scale. The drawings are intended to depict typical aspects of the disclosure, and therefore should not be considered as limiting the scope of the disclosure. In the drawings, like numbering represents like elements between the drawings.

DETAILED DESCRIPTION

In the description herein, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made within the scope of the present teachings. The description herein is, therefore, merely illustrative.

Embodiments of the disclosure provide an integrated circuit (IC) structure with a high impedance semiconductor material between a substrate and transistor. The IC structure may be formed on a substrate, e.g., a bulk region of semiconductor material. The structure may also include a layer of a high impedance semiconductor material on a portion of the substrate, which may be embedded within the semiconductor material. The IC structure may include a transistor on top of the high impedance semiconductor material. The transistor includes a semiconductor channel region horizontally between a first source/drain (S/D) region and a second S/D region. In this configuration, the high impedance semiconductor material electrically insulates active regions of the transistor from the underlying substrate at RF frequencies, while permitting DC bias voltages to be applied to the substrate from other contacts. One or more insulator regions may be on the substrate and horizontally adjacent the first or second S/D region. One or more doped wells on the substrate may be horizontally adjacent a respective insulator region. The insulator regions horizontally separate the transistor from the doped wells. The doped wells, by being located near the transistor, may enable electrical biasing of the substrate beneath the high impedance semiconductor material.

Referring to FIG. 1, a cross-sectional view of an integrated circuit (IC) structure 100 according to embodiments of the disclosure is shown. IC structure 100 may be formed from a substrate 102 including, e.g., one or more semiconductor materials. Substrate 102 can include any currently known or later-developed semiconductor material, which may include without limitation, silicon, germanium, silicon carbide, and those including essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained. Substrate 102 may include a layer of bulk silicon, but in further embodiments may take the form of a semiconductor on insulator (SOI) substrate, a semiconductor fin, and/or other types of substrates.

To provide biasing elements for transistors, substrate 102 may include one or more doped regions in the form of a first doped well 104a having a first doping type. Substrate 102 may also include a second doped well 104b, also having the same (i.e., first) doping type. First doped well 104a and second doped well 104b each may be in substrate 102 in locations that are distinct and horizontally distal to each other. According to one example, the first doping type may be P-type doping. When referring to dopants, P-type dopants refer to elements introduced into semiconductor material to generate free holes by "accepting" electrons from a semiconductor atom and consequently "releasing" the hole. The acceptor atom must have one valence electron less than the host semiconductor. P-type dopants suitable for use in substrate 102 may include but are not limited to: boron (B), indium (In) and gallium (Ga). Boron (B) is the most common acceptor in silicon technology. Further alternatives include In and Ga. Ga features high diffusivity in silicon dioxide ($SiO_2$), and hence, the oxide cannot be used as a mask during Ga diffusion.

Non-doped portions of substrate 102 may separate first doped well 104a from second doped well 104b. First doped well 104a and second doped well 104b may be formed within substrate 102, e.g., by vertical ion implantation. In some cases, substrate 102 may also include dopants. In such cases, doped wells 104a, 104b may have the same doping type as substrate 102, but with a higher dopant concentration of the first doping type (e.g., P-type doping) than substrate 102. Doped wells 104a, 104b thus may be distinguished from substrate 102 at least partially based on their doping concentration, dopant materials, etc., even where doped wells 104a, 104b and substrate 102 are of the same doping type. Substrate 102 may include other doped wells having the same, or different doping types, and such wells are omitted from FIG. 1 solely for clarity.

IC structure 100 may include a high impedance semiconductor material 106 on a portion of substrate 102. High impedance semiconductor material 106 may be formed of silicon (Si) and/or any other semiconductor material capable of taking on a highly resistive form, i.e., significantly higher electrical impedance than substrate 102. The term "high impedance" as used herein, may refer to materials having an impedance of at least approximately ten megaohms (Me). To form high impedance semiconductor material 106, crystalline semiconductor material may be formed on, or converted from, other portions of substrate 102. The crystalline semiconductor material may be converted into polycrystalline silicon (poly-Si) through any currently known or later developed process to form high impedance materials, e.g., deliberately damaging crystalline semiconductor material through implants, annealing, and/or other operations. Polycrystalline semiconductor material refers to any multi crystalline thin-film semiconductor that features no long-range crystallographic order The polycrystalline semiconductor material may be converted from amorphous silicon (α-Si), and in this case, some portions of amorphous material may remain within or nearby high impedance semiconductor material 106. Due to the variety of compositions that may be included within the resulting material, high impedance semiconductor material 106 generally may include any semiconductor material or combination of semiconductor-based materials (e.g., polycrystalline silicon, one or more multi-crystalline films of semiconductor material, etc.) exhibiting an impedance of at least approximately ten Me as noted herein. Polycrystalline semiconductor material in particular provides electrical insulation, as compared to single-crystal (e.g., materials within substrate 102 and doped wells 104a, 104b).

High impedance semiconductor material 106 may be formed on a portion of substrate 102 that is between doped wells 104a, 104b, while being physically separated from doped wells 104a, 104b. In this position, high impedance semiconductor material 106 may electrically separate substrate 102 from other materials and/or structures formed thereon. A top surface J of high impedance semiconductor material 106 may be substantially coplanar with an adjacent upper surface of substrate 102.

IC structure 100 may include a transistor 110 on top surface J of high impedance semiconductor material 106. Transistor 110 may include a channel region 112 (e.g., crystalline semiconductor having the same doping type as doped well(s) 104a, 104b), and thus may be known as a "shallow well" in some contexts. Channel region 112 may be horizontally between a first source/drain (S/D) region 114a and a second S/D region 114b. S/D regions 114a, 114b may have a second doping type that is opposite the doping type of first doped well 104a and second doped well 104b (e.g., N-type doping). S/D regions 114a, 114b may be formed by introducing N-type dopants into substrate 102 and/or precursor semiconductor material by any currently known or later developed technique, e.g., ion implantation. N-type dopants are elements introduced into semiconductor materials to generate free electrons, e.g., by "donating" an electron to semiconductor. N-type dopants must have one more valance electron than the semiconductor. Common N-type donors in silicon (Si) include, e.g., phosphorous (P), arsenic (As), and/or antimony (Sb).

Transistor 110 may include a gate dielectric layer 116 over channel region 112. Gate dielectric layer 116 may include a high-k dielectric, such as, but not limited to: metal oxides tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gate dielectric layer 116 may include any conceivable insulating material, such as, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) [$(CH_3)_2SiO]_4$ 2.7 available from Air Liquide, etc., or other low dielectric constant (k<3.9) material, or combinations thereof. Gate dielectric layer 116 may also include high-k dielectric materials, such as, but not limited to, hafnium silicate (HfSiO), zirconium silicate ($ZrSiO_x$), silicon oxynitride (SiON), or any combination of these materials.

Transistor 110 may include a gate structure 118 over gate dielectric layer 116 and in between S/D regions 114a, 114b. Gate structure 118, during operation, may serve to apply a voltage to channel region 114 across gate dielectric 116, thereby putting transistor 110 an operational state, e.g., (allowing charge carriers to flow from first S/D region 114a to second S/D region 114b or vice versa). It will be appreciated by those skilled in the art that gate structure 118 may include one or more layers, potentially forming a gate stack. Gate structure 118 may be formed from doped or undoped polycrystalline silicon (poly-Si) according to one example. In further examples, gate structure 118 may include materials \such as, but not limited to, aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), tungsten (W), tungsten nitride (WN), tungsten carbide (WC), and/or combinations thereof. Various insulating materials (e.g., spacers) may be included within and/or formed on sidewalls of gate structure 118, but such materials are omitted from FIG. 1 solely for clarity of illustration.

A set of insulator regions, separately identified as a first insulator region 120a and a second insulator region 120b, separate transistor 110 from first doped well 104a and second doped well 104b, respectively. Insulator regions 120a, 120b may be identified and referred to as "trench isolations," and thus may be provided in the form of shallow or deep trench isolations. In this case, insulator regions 120a, 120b may be provided by forming a trench within selected portions of substrate 102 and filling the trench with an insulating material such as oxide, to isolate one region of the substrate from an adjacent region of the substrate. Where two insulator regions 120a, 120b are provided, high impedance semiconductor material 106 may extend continuously from a first end E1 beneath first insulator region 120a to a second end E2 beneath second insulator region 120b. A separation distance L between first doped well 104a or second doped well 104b and high impedance semiconductor material 106 may be less than the horizontal width of the overlying insulator region 120a, 120b. In this configuration, high impedance semiconductor material 106, together with insulator regions 120a, 120b, physically isolate substrate 102 from transistor 110. Transistor 110, and/or other devices where applicable, may be disposed within an area isolated by insulator region(s) 120a, 120b. Each insulator region 120a, 120b may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Transistor 110 may be capable of functioning under predetermined conditions, e.g., by causing a voltage applied via gate structure 118 to control the flow of current between S/D regions 114a, 114b. Embodiments of IC structure 100 may include additional components for electrically biasing transistor 110 itself, e.g., via a body voltage. Among other things, a biasing voltage applied to substrate 102 may influence the gate structure 118 voltage needed for current to flow between S/D regions 114a, 114b, and/or the flow of current between S/D regions 114a, 114b during the application of such a voltage. Conventional transistors may include a body contact for electrically biasing substrate materials beneath a transistor. Such transistors may include one or more layers of insulative and/or alternately doped material to physically and electrically separate the biased substrate material from active regions of the device. Embodiments of the disclosure, however, avoid the use of additional insulative materials through the inclusion of high impedance semiconductor material 106, discussed herein.

IC structure 100 may include body terminals in the form of, e.g., a first body contact 122a on first doped well 104a and/or a second body contact 122b on second doped well 104b. Body contacts 122a, 122b may be formed of doped semiconductor material and originally may have formed part of substrate 102 before being doped. However provided, body contacts 122a and 122b are of a first dopant type (e.g., P+ doping). According to an example, body contact(s) 122a, 122b may be directly horizontally adjacent an upper portion of insulative region 120a, 122b, and may be located directly on doped well 104a, 104b. The vertical interface between each doped well 104a, 104b and body contact 122a, 122b pair may bisect a sidewall of insulative region 120a, 120b as shown in FIG. 1.

IC structure 100 may include an inter-level dielectric (ILD) 130 formed above body contacts 122a, 122b, insulative regions 120a, 120b, and transistor 110, e.g., by deposition or other techniques of forming an insulative material on a structure. ILD 130 may include the same insulating material as insulative region(s) 120a, 120b, or may include a different electrically insulative material. ILD 130 and insulative region(s) 120a, 120b nonetheless constitute different components, e.g., due to insulative region(s) 120a, 120b being formed from portions of substrate 102 instead of being formed thereon. Additional metallization layers (not shown) may be formed on ILD 130 during middle-of-line and/or back-end-of-line processing. To electrically couple various portions of IC structure 100 to such metallization layers, a set of S/D contacts 132a, 132b may be formed on S/D regions 114a, 114b and within ILD 130. Similarly, a gate contact 134 may be formed on gate structure 118 and within ILD 130. Additionally, one or more body contacts 134a, 134b may be formed on body terminals 122a, 122b and within ILD 130.

One or more of contacts 130a, 130b, 132, 134a, 134b to overlying circuit elements may be formed within predetermined portions of ILD 130 by a controlled amount of vertical etching to form openings to one or more contact sites, and then filling the openings with a conductor. Each contact 130a, 130b, 132, 134a, 134b may include any currently known or later developed conductive material configured for use in an electrical contact, e.g., copper (Cu), aluminum (Al), gold (Au), etc. Contacts 132a, 132b, 134, 136a, 136b may additionally include refractory metal liners (not shown) positioned alongside ILD 130 to prevent electromigration degradation, shorting to other components, etc. Additionally, selected portions of S/D regions 114a, 114b, gate structure 118, and/or body terminals 122a, 122b may include silicide regions (i.e., portions of semiconductor that are annealed in the presence of an overlying conductor to increase the electrical conductivity of semiconductor regions) to increase the electrical conductivity from contacts 132a, 132b, 134, 136a, 136b.

Applying a voltage to body contact(s) 122a, 122b during operation of a device may electrically bias its underlying doped well 104a, 104b and adjacent portions of substrate 102. However, high impedance semiconductor material 106 will prevent such a bias from forming a low resistance electrical pathway from body contact(s) 122a, 122b to channel region 112 of transistor 110. Formation of high impedance semiconductor material 106 prevents any noise being coupled from substrate or from adjacent device (may be another MOSFET, diode, BJT etc.). Applying a bias voltage to body contact(s) 122a, 122b may affect, e.g., the threshold voltage required from gate structure 118 to form a conductive pathway through channel region 112 of transistor 110, through high impedance semiconductor material 106. The electrical biasing of substrate 102 may be provided through each of body terminals 122a, 122b simultaneously, or may be provided solely through one body terminal 122a, 122b. In this configuration, portions of substrate 102 beneath amorphous semiconductor material 106 may not require additional doping so long as they are in close proximity (e.g., approximately five microns (um)) away from doped well(s) 104a, 104b. The minimum distance for a particular application may vary, and typically is governed by rules defined in Design Rule Check (DRC) for a given technology. To provide and/or enhance these electrical properties, substrate 102, doped wells 104a, 104b, transistor 110, and/or other elements of IC structure 100 may be free of amorphous semiconductor materials.

Figure 2:
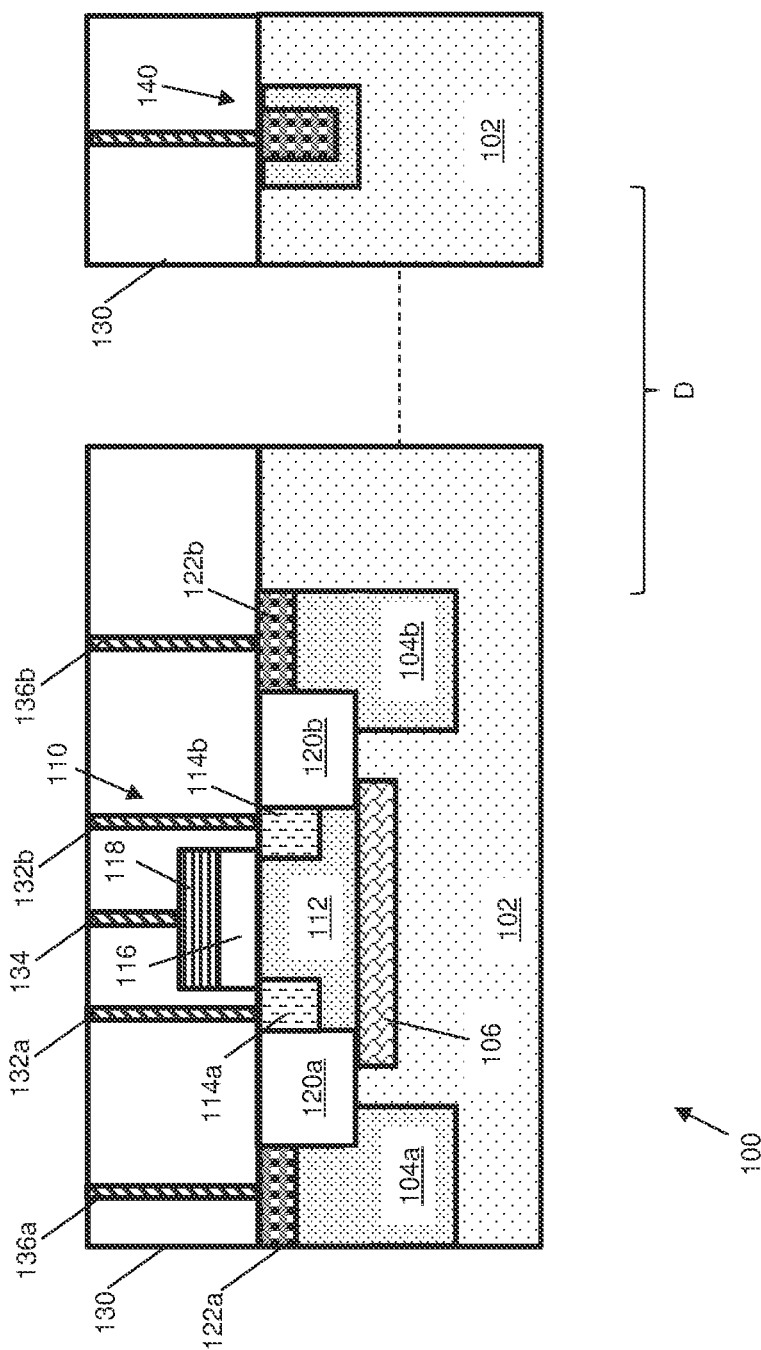
FIG. 2 provides another cross-sectional view of an IC structure and active device according to embodiments of the disclosure.

Referring to FIG. 2, embodiments of IC structure 100 may allow for electrical biasing of transistor 110 without requiring additional insulative materials to be formed in substrate 102, apart from high impedance semiconductor material 106 and insulative region(s) 120a, 120b. FIG. 2 depicts an implementation of IC structure 100, in which substrate 102 spans an indeterminate horizontal length from a transistor 110 to an active device 140 that is also formed on or within substrate 102. Active device 140 may include any conceivable electrically active element that is formed within substrate 102 and operationally distinct from transistor 110. Active device 140 is shown by example to be a doped region within substrate 102 (e.g., part of a diode junction extending into or out of the plane of the page), but active device 140 in further examples may include one or more of a transistor, capacitor, resistor, and/or other electrical element formed on or within substrate 102.

Portions of substrate 102 located between transistor 110 and active device 140 may define a separation region D of substrate 102. Separation region D is illustrated partially with a broken line to indicate an indeterminate length. According to one example, separation region D may have a horizontal width of at least approximately thirty microns (um), and in various implementations may be fifty microns, one-hundred microns, five-hundred microns, etc. However implemented, separation region D may be defined as including all portions of substrate 102 that are between substrate 102 and active device 140 that are free of other electrically active devices and/or insulative materials formed on or within substrate 102. In addition, the size of separation region D may prevent any electrical currents within active device 140 from electrically biasing substrate 102 beneath channel region 112, despite the absence of additional insulative materials within separation region D. The presence of body contacts 122a, 122b, provide strong local control, which makes the electrical behavior of transistor 110 independent of any other active or passive devices on IC 100.

Figure 3:
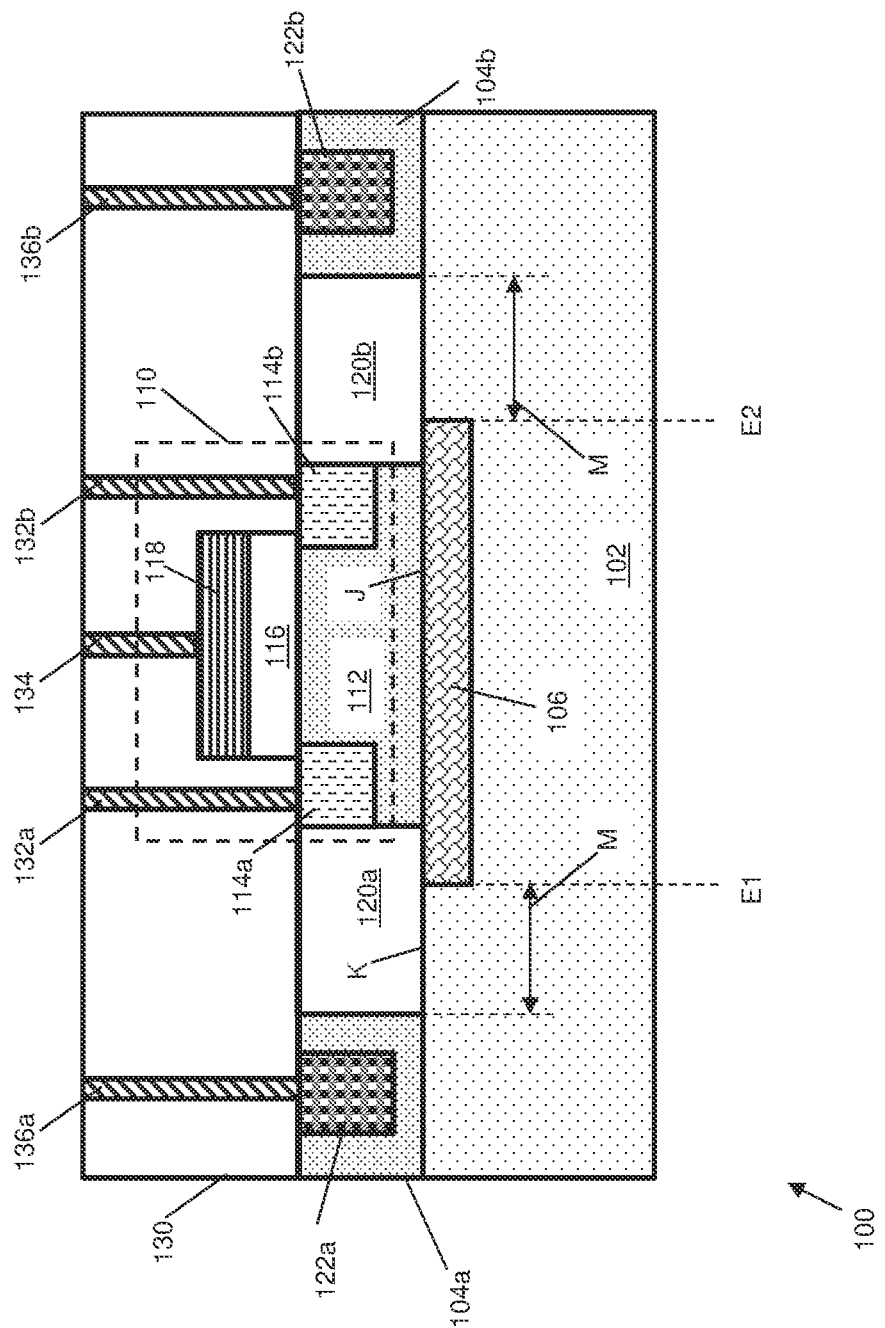
FIG. 3 provides a cross-sectional view of an IC structure with a high impedance semiconductor material between a substrate and transistor according to further embodiments of the disclosure.

Turning now to FIG. 3, further embodiments of IC structure 100 may include further configurations of components adjacent transistor 110. Similar to other configurations discussed herein, IC structure 100 may include substrate 102, high impedance semiconductor material 106 formed on a portion of substrate 102, and transistor 110 on high impedance semiconductor material 106. High impedance semiconductor material 106 vertically separates substrate 102 from channel region 112 of transistor 110 thereover. Transistor 110 may be horizontally between first and second insulative regions 120a, 120b. In the FIG. 3 configuration, however, top surface J of high impedance semiconductor material 106 may be coplanar with a top surface K of substrate 102. Here, substrate 102 may be free of doped well regions, with high impedance semiconductor material 106 defining the only distinct region of material within substrate 102. First doped well 104a and/or second doped well 104b may remain present in IC structure 100, by being formed on upper surface K of substrate 102 and adjacent insulative region(s) 120a, 120b. In this configuration, body terminal(s) 122a, 122b each may be formed by introducing dopants into a respective doped well 104a, 104b and forming contact(s) 136a, 136b to body terminal(s) 122a, 122b.

In the FIG. 3 configuration, body terminals 122a, 122b remain capable of electrically biasing substrate 102 beneath channel region 112, and adjacent portions of substrate 102. Although doped wells 104a, 104b do not extend beneath top surface K of substrate 102, a horizontal separation distance M between each end E1, E2 of high impedance semiconductor material 106 and respective doped wells 104a, 104b may be, e.g., at most approximately five microns. Formation of high impedance semiconductor material 106 prevents any noise being coupled from substrate or from adjacent device (may be another MOSFET, diode, BJT, etc.). In such a configuration, applying a voltage to body terminals 122a, 122b may affect the threshold voltage of transistor 110 and hence the ability for transistor 110 to form a conductive pathway through channel region 112. Separation distance M, additionally, may be less than the horizontal width of insulative regions 120a, 120b to prevent current pathways from forming between doped well(s) 104a, 104b and channel region 112 of transistor 110.

Figure 4:
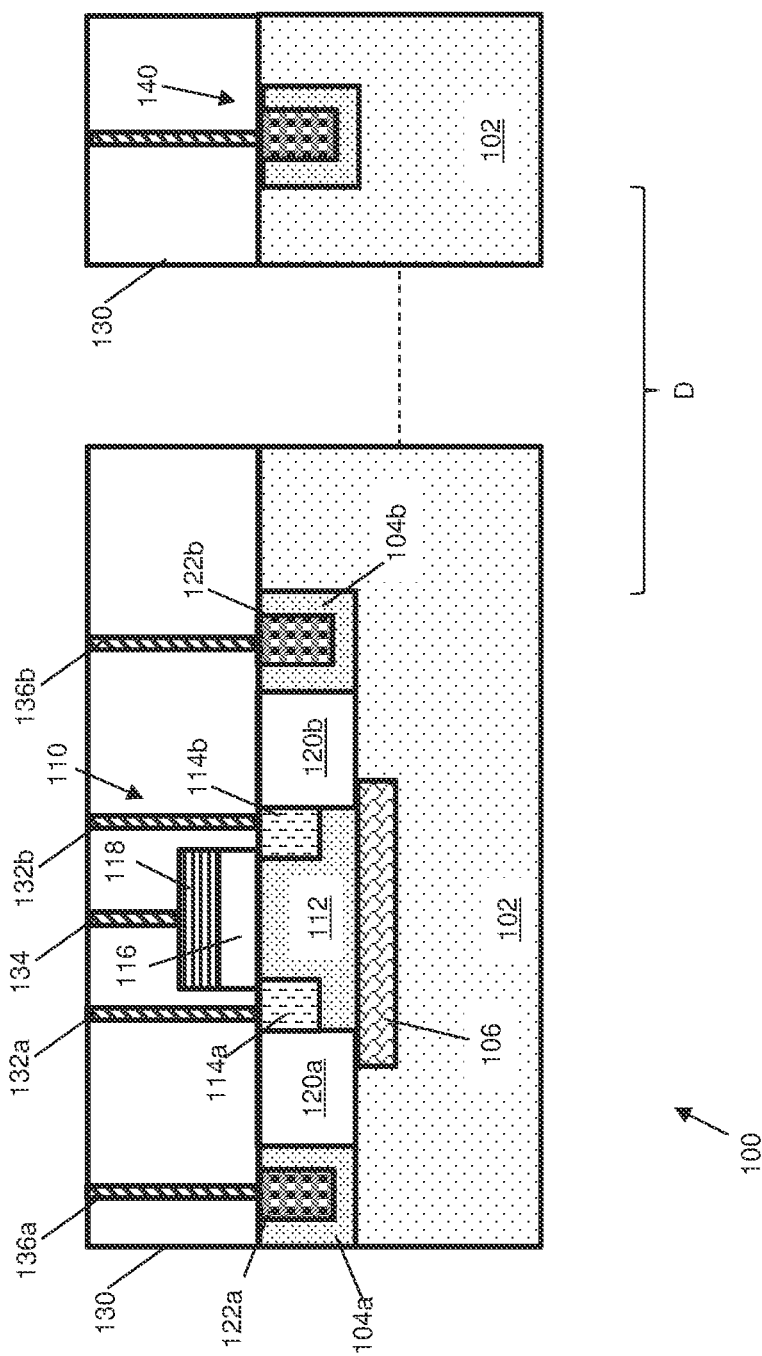
FIG. 4 provides another cross-sectional view of an IC structure and active device according to further embodiments of the disclosure.

Referring to FIGS. 3 and 4, the embodiment of IC structure 100 similarly may be usable with active device(s) 140 formed on substrate 102, without requiring additional insulative materials to be formed on or within substrate 102. As shown in FIG. 4, substrate 102 may span an indeterminate horizontal length from a transistor 110 to active device 140. As discussed elsewhere herein, active device 140 may include any conceivable electrically active element that is formed within substrate 102 and operationally distinct from transistor 110 (e.g., transistor, capacitor, resistor, and/or other electrically active elements). Separation region D is illustrated partially with a broken line to indicate an indeterminate length, and may have a horizontal width of at least approximately thirty microns as discussed elsewhere herein. Separation region D may include all portions of substrate 102 that are between substrate 102 and active device 140 that are free of other electrically active devices and/or insulative materials formed on or within substrate 102. Separation region D may be large enough to prevent electrical currents within active device 140 from electrically biasing substrate 102 beneath channel region 112, despite the absence of additional insulative materials within separation region D. The size and scale of separation region D, similarly, may prevent electrical biasing to doped wells 104a, 104b from significantly affecting active device 140.

Embodiments of the disclosure may provide several technical and commercial advantages, some of which here discussed herein by way of example. By providing high impedance semiconductor material 106 between substrate 102 and transistor 110, without other insulative and/or other high impedance materials within other portions of substrate 100 within first region 102, body terminal(s) 122a, 122b can effectively bias channel region 112 with strong local control. As compared with insulative regions of material formed on or within substrate 102 (e.g., in conventional structures), embodiments of IC structure 100 provide a significantly reduced junction capacitance between substrate 102 and channel region 112 as bias voltages are applied to substrate 102. Due to the inherent properties of high impedance semiconductor materials, these technical features are achievable with high impedance semiconductor material that is relatively thin in comparison to insulative materials and/or layers that conventionally form part of a body terminal to a transistor channel region. During operation, these features of IC structure 100 may prevent significant deviations between the expected values of voltage gain across the body terminal of transistor 110, and its actual values. As also discussed herein, embodiments of IC structure 100 prevent electrical biasing of substrate 102 beneath high impedance semiconductor material 106 from interfering with active device(s) 140 formed elsewhere on substrate 102.

The descriptions of the various embodiments of the present disclosure have been presented for purposes of illustration, but are not intended to be exhaustive and/or limited to the embodiments disclosed. Many modifications and variations will be apparent to those of ordinary skill in the art within the scope and spirit of the described embodiments The terminology used herein was chosen to best explain the principles of the embodiments, the practical application and/or technical improvement over technologies found in the marketplace, and/or to enable others of ordinary skill in the art to understand the embodiments disclosed herein.

What is claimed is:
1. An integrated circuit (IC) structure, comprising:
a substrate;
a high impedance semiconductor material on a portion of the substrate;
a transistor on a top surface of the high impedance semiconductor material, the transistor including a semiconductor channel region horizontally between a first source/drain (S/D) region and a second S/D region, wherein the high impedance semiconductor material is vertically between the transistor and the substrate;
a first insulator region on the substrate and horizontally adjacent the first S/D region; and
a first doped well on the substrate and horizontally adjacent the first insulator region, wherein the first insulator region is horizontally between the first doped well and the transistor.
2. The IC structure of claim 1, further comprising:
a second insulator region on the substrate and horizontally adjacent the second S/D region; and
a second doped well on the substrate and horizontally adjacent the second insulator region, wherein the second insulator region is horizontally between the second doped well and the transistor.
3. The IC structure of claim 2, wherein the high impedance semiconductor material extends continuously from a first end beneath the first insulator region to a second end beneath the second insulator region.
4. The IC structure of claim 1, wherein a portion of the substrate below the first insulator region is horizontally between the high impedance semiconductor material and the first doped well.
5. The IC structure of claim 1, wherein the high impedance semiconductor material comprises polycrystalline silicon, and wherein the substrate, the first doped well, and the transistor are free of polycrystalline silicon.
6. The IC structure of claim 1, wherein the first doped well and the semiconductor channel region of the transistor have a first doping type, and wherein the first S/D region and the second S/D region have a second doping type opposite the first doping type.
7. The IC structure of claim 1, wherein a horizontal separation between the high impedance semiconductor material and first doped well is less than a horizontal width of the first insulator region.
8. The IC structure of claim 1, further comprising a body terminal to the first doped well, wherein the body terminal is configured to electrically bias a portion of the substrate beneath the high impedance semiconductor material.
9. The IC structure of claim 1, further comprising an active device within the substrate, wherein the substrate includes a separation region horizontally between the active device and the first doped well.

10. The IC structure of claim 9, wherein a horizontal width of the separation region of the substrate prevents the active device from electrically biasing a portion of the substrate beneath the high impedance semiconductor material.

11. An integrated circuit (IC) structure, comprising:
a substrate having a top surface;
a high impedance semiconductor material within the substrate, wherein a top surface of the high impedance semiconductor material is coplanar with the top surface of the substrate;
a transistor on the top surface of the high impedance semiconductor material, the transistor including a semiconductor channel region horizontally between a first source/drain (S/D) region and a second S/D region, wherein the high impedance semiconductor material is vertically between the transistor and the substrate;
a first insulator region on the top surface of the substrate and horizontally adjacent the first S/D region;
a first doped well within the substrate and horizontally adjacent the first insulator region, wherein the first insulator region is horizontally between the first doped well and the first S/D region of the transistor;
a first body terminal on the first doped well;
a second insulator region on the top surface of the substrate and horizontally adjacent the second S/D region;
a second doped well within the substrate and horizontally adjacent the second insulator region, wherein the second insulator region is horizontally between the second doped well and the second S/D region of the transistor; and
a second body terminal on the second doped well.

12. The IC structure of claim 11, wherein the high impedance semiconductor material extends continuously from a first end beneath the first insulator region to a second end beneath the second insulator region.

13. The IC structure of claim 11, wherein a bottom surface of the first insulator region is below a top surface of the first doped well, and wherein a bottom surface of the second insulator region is below a top surface of the second doped well.

14. The IC structure of claim 11, further comprising an active device within the substrate, wherein the substrate includes a separation region horizontally between the active device and the first doped well or the second doped well.

15. The IC structure of claim 14, wherein a horizontal width of the separation region of the substrate prevents the active device from electrically biasing a portion of the substrate beneath the high impedance semiconductor material.

16. An integrated circuit (IC) structure, comprising:
a substrate having a top surface;
a high impedance semiconductor material within the substrate, wherein a top surface of the high impedance semiconductor material is coplanar with the top surface of the substrate;
a transistor on the top surface of the high impedance semiconductor material, the transistor including a semiconductor channel region horizontally between a first source/drain (S/D) region and a second S/D region, wherein the high impedance semiconductor material is vertically between the transistor and the substrate;
a first insulator region on the top surface of the substrate and the top surface of the high impedance semiconductor material, and horizontally adjacent the first S/D region;
a second insulator region on the top surface of the substrate and the top surface of the high impedance semiconductor material, and horizontally adjacent the second S/D region;
a first doped well on the top surface of the substrate, and horizontally adjacent the first insulator region and the substrate, wherein the first insulator region is horizontally between the first doped well and the transistor;
a first body terminal within the first doped well;
a second doped well on the top surface of the substrate and horizontally adjacent the first insulator region and the substrate, wherein the second insulator region is horizontally between the second doped well and the transistor; and
a second body terminal within the second doped well.

17. The IC structure of claim 16, wherein the high impedance semiconductor material extends continuously horizontally from a first end beneath the first insulator region to a second end beneath the second insulator region.

18. The IC structure of claim 16, wherein a bottom surface of the first insulator region is coplanar with a bottom surface of the first doped well, and wherein a bottom surface of the second insulator region is coplanar with a bottom surface of the second doped well.

19. The IC structure of claim 16, further comprising an active device within the substrate, wherein the substrate includes a separation region horizontally between the active device and the first doped well or the second doped well.

20. The IC structure of claim 19, wherein a horizontal width of the separation region of the substrate prevents the active device from electrically biasing a portion of the substrate beneath the high impedance semiconductor material.

* * * * *